United States Patent [19]
Ben-Efraim et al.

[11] Patent Number: 5,592,492
[45] Date of Patent: Jan. 7, 1997

[54] CONVOLUTIONAL INTERLEAVING/DE-INTERLEAVING METHOD AND APPARATUS FOR DATA TRANSMISSION

[75] Inventors: Nadav Ben-Efraim, Sunnyvale; Peter T. Liu, Alameda, both of Calif.

[73] Assignee: LSI Logic Corporation, Milpitas, Calif.

[21] Appl. No.: 242,199

[22] Filed: May 13, 1994

[51] Int. Cl.⁶ .................................................. G06F 11/00
[52] U.S. Cl. ............................................. 371/2.2; 371/2.1
[58] Field of Search ........................... 371/2.2, 2.1, 21.1, 371/10.1, 38.1, 39.1; 395/481

[56] References Cited

U.S. PATENT DOCUMENTS

| | | | |
|---|---|---|---|
| 4,559,625 | 12/1985 | Berlekamp et al. | 371/2 |
| 4,707,805 | 11/1987 | Narusawa et al. | 364/900 |
| 4,710,923 | 12/1987 | Nagymo | 371/2 |
| 5,353,024 | 10/1994 | Graybill | 341/51 |

OTHER PUBLICATIONS

Ramsey, John L., *Realization Of Optimum Interleavers*, "IEEE Transactions On Information Theory", May, 1970, pp. 333–345.

Forney, David G. (Jr.), *Burst–Correcting Codes For The Classic Bursty Channel*, "IEEE Transactions On Communications Technology", Oct. 1971, pp. 772–780.

*Primary Examiner*—Robert W. Beausoliel, Jr.
*Assistant Examiner*—Phung My Chung
*Attorney, Agent, or Firm*—Poms, Smith, Lande & Rose

[57] ABSTRACT

In a method and apparatus for selective convolutional interleaving or de-interleaving of symbols or data bits, a plurality of segments are defined in random access memory, with each segment including a different number of locations for storing symbols. Previously stored symbols are sequentially read out of current locations in the segments respectively, and new symbols are read into the current locations. Next locations in the segments are redesignated as current locations respectively, and the operation is repeated until all of the symbols have been interleaved or de-interleaved. The first location in each segment is designated by a respective segment pointer. The current and next locations are designated as relative offset pointers from the segment pointers, and these locations are incremented by incrementing the offset pointers. Interleaving or de-interleaving operation is determined by the direction in which the segments are sequentially selected for the read/write operations.

26 Claims, 4 Drawing Sheets

| OPERATION CYCLE | INTERLEAVE OPERATION (B = 4) ||||||||||||
| --- | --- | --- | --- | --- | --- | --- | --- | --- | --- | --- | --- | --- |
| | SEGMENT 70 | SEGMENT 72 || SEGMENT 74 |||| SEGMENT 76 ||||||
| | DIRECT | 44 | 45 | 46 | 47 | 48 | 49 | 50 | 51 | 52 | 53 | 54 | 55 |
| 1 | 1(1) | | | | | | | | | | | | |
| 2 | | 2 | | | | | | | | | | | |
| 3 | | | | 3 | | | | | | | | | |
| 4 | | | | | | | | 4 | | | | | |
| 5 | 5(5) | | | | | | | | | | | | |
| 6 | | | 6 | | | | | | | | | | |
| 7 | | | | | 7 | | | | | | | | |
| 8 | | | | | | | | | 8 | | | | |
| 9 | 9(9) | | | | | | | | | | | | |
| 10 | | 10(2) | | | | | | | | | | | |
| 11 | | | | | | 11 | | | | | | | |
| 12 | | | | | | | | | | 12 | | | |
| 13 | 13(13) | | | | | | | | | | | | |
| 14 | | | 14(6) | | | | | | | | | | |
| 15 | | | | | | | 15 | | | | | | |
| 16 | | | | | | | | | | | 16 | | |
| 17 | 17(17) | | | | | | | | | | | | |
| 18 | | 18(10) | | | | | | | | | | | |
| 19 | | | | 19(3) | | | | | | | | | |
| 20 | | | | | | | | | | | | 20 | |
| 21 | 21(21) | | | | | | | | | | | | |
| 22 | | | 22(14) | | | | | | | | | | |
| 23 | | | | | 23(7) | | | | | | | | |
| 24 | | | | | | | | | | | | | 24 |
| 25 | 25(25) | | | | | | | | | | | | |
| 26 | | 26(18) | | | | | | | | | | | |
| 27 | | | | | | 27(11) | | | | | | | |
| 28 | | | | | | | | 28(4) | | | | | |
| 29 | 29(29) | | | | | | | | | | | | |
| 30 | | | 30(22) | | | | | | | | | | |
| 31 | | | | | | | 31(15) | | | | | | |
| 32 | | | | | | | | | 32(8) | | | | |

Fig. 7

CONVOLUTIONAL INTERLEAVING/DE-INTERLEAVING METHOD AND APPARATUS FOR DATA TRANSMISSION

BACKGROUND OF THE INVENTION

1. Field of the Invention

The present invention generally relates to the art of electronic data transmission, and more specifically to a method and apparatus for convolutional interleaving and de-interleaving of data for correcting bursts of errors in transmitted data.

2. Description of the Related Art

In many applications of communications technology, interleaving is used in combination with encoding for error correction. One technique, which is applicable to some types of burst-error communications channels, is to insert an interleaver between the channel encoder at the transmitting end and the channel. The interleaver redistributes the data bits or symbols being transmitted over the channel so that the symbols are mutually separated by substantially more than the length of a "typical" burst of errors.

Interleaving effectively makes the channel appear like a random-error channel to a decoder at the receiving end. For some high frequency channels, this technique can improve the performance by one to three orders of magnitude.

Improvements in digital communications technology have increased the demands on Forward Error Correction (FEC) techniques. For example, compressed video systems require an extremely low Bit-Error Rate (BER) on the order of 1e-12 (one error per $10^{12}$ bits of data). Conventional FEC techniques require high transmitter power and large data overhead to achieve these low BERs. The concatenation and interleaving of several FEC techniques reduces the power and bandwidth expansion required by a single error correction code to obtain the same low error rate.

Figure 1:
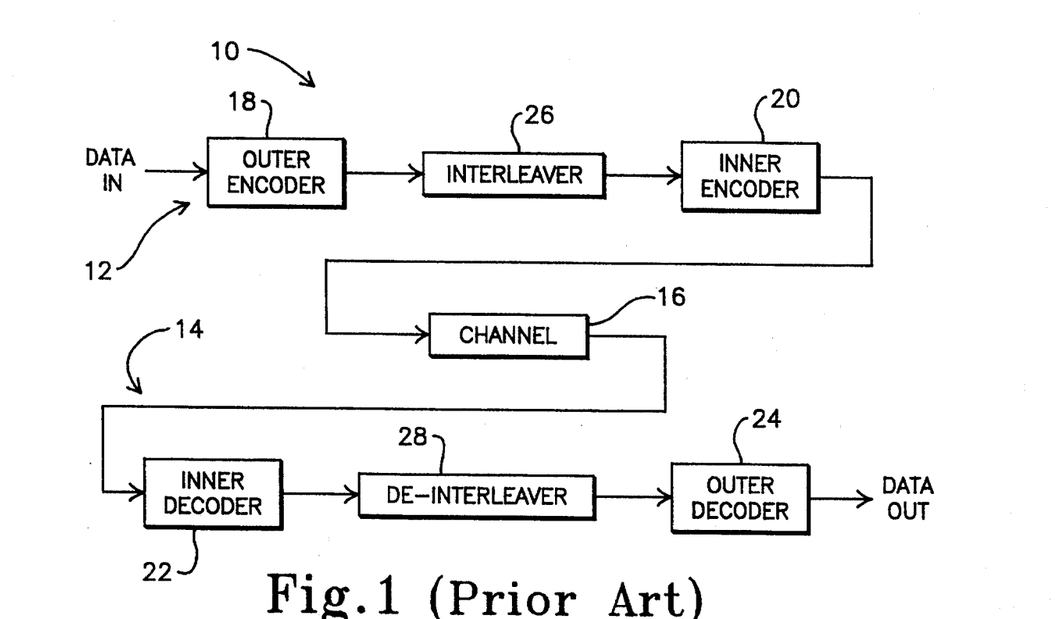
FIG. 1 is a block diagram of a conventional concatenated/interleaved data communications system.

FIG. 1 illustrates a basic interleaved/concatenated FEC communications system 10, comprising a transmitter 12 and a receiver 14 that are connected by a communications channel 16. The transmitter 12 includes a first or outer encoder 18 that encodes input data using a Reed-Solomon code or other suitable code, and a second or inner encoder 20 that further encodes the data using a Convolutional or Hamming code. The receiver 14 includes an inner decoder 22 and an outer decoder 24 that are conjugate to the encoders 18 and 20 respectively.

The "rate" R of the code is defined as the reciprocal of the bandwidth expansion. For instance an R=½ code doubles the bandwidth or data rate in the transmission channel. If two individual codes are used, the overall rate is the product of the two codes.

Another measure of the effectiveness of an error correction technique is the Signal to Noise Ratio (SNR) that is required to obtain the necessary BER at the output of the outer decoder 24. A low SNR corresponds to a low power requirement for the transmitter 12, and thereby lower cost. The best codes have a high rate R and a low SNR for a given BER.

The inner codes that are selected usually perform well at low SNR (high channel BER). They can easily push the BER from the range of 1e-2 to the range of 1e-4. However, it is difficult for the inner code alone to reach the 1e-12 BER system requirement.

The outer codes, on the other hand, can easily push the BER from 1e-4 to 1e-12, but usually will not work at low SNR. Hence, the concatenated scheme is highly desirable for systems such as Direct Broadcast Satellite (DBS), and create only a moderate bandwidth expansion.

The above analysis applies only to the assumption that the errors are uncorrelated or randomly distributed. In practical applications, however, the output of the inner decoder 22 tends to be very bursty. This causes the error pattern to be highly correlated and concentrated only in a small portion of the bit stream. Under these conditions, the outer decoder 24 will not perform effectively. In order to alleviate this problem, an interleaving/de-interleaving function is added to the system 10.

Figure 2:
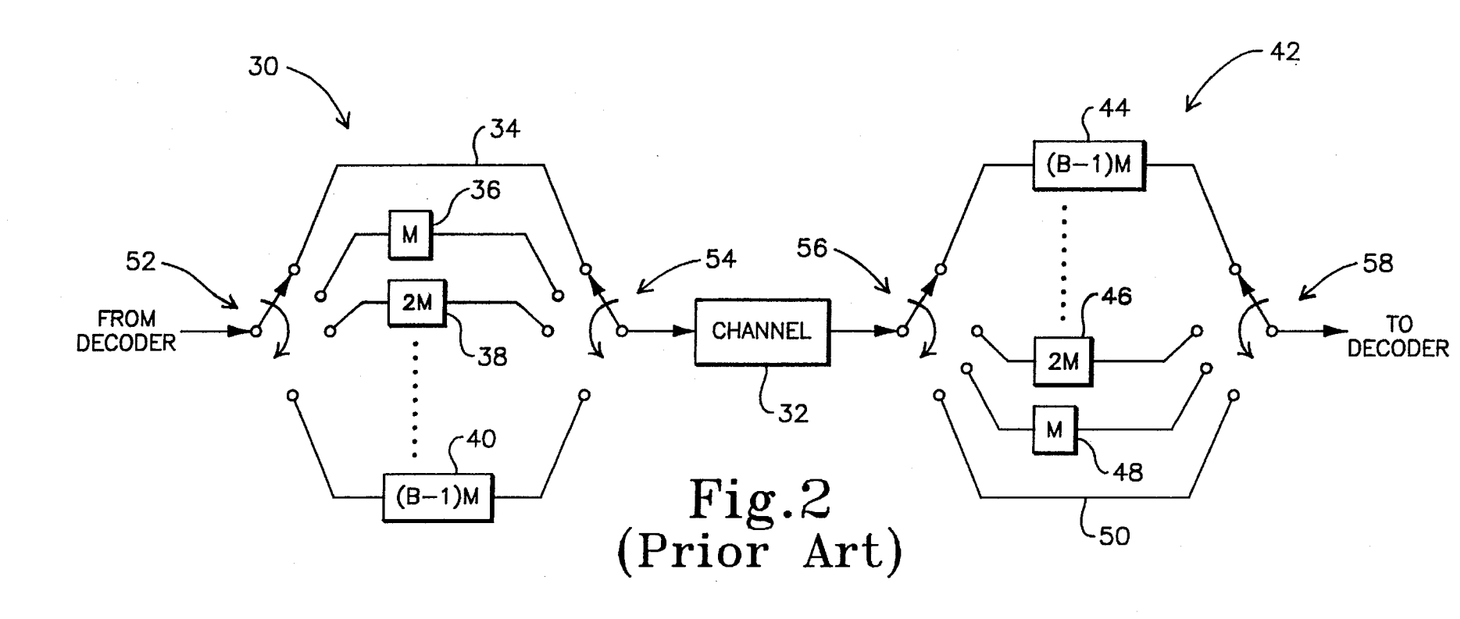
FIG. 2 is a simplified diagram illustrating a known convolutional interleaving/de-interleaving method utilizing shift registers.

As further illustrated in FIG. 2, the system 10 further comprises an interleaver 26 connected between the encoders 18 and 20 and a de-interleaver 28 connected between the decoders 22 and 24. The interleaver 26 reorders a sequence of symbols or data bits in a one-to-one deterministic manner. The de-interleaver 28 restores the reordered sequence to its original ordering.

More specifically, the de-interleaver 28 breaks the bursts of errors from the inner decoder 22 into pieces and spreads the errors into several different outer code words. This eases the burden on the outer decoder 24, which is able to clean up the remaining errors successfully.

The reduction of required power by one-half for the concatenated code can result in a significantly lowered cost in an application such as Direct Broadcast Satellite (DBS) video systems. The reduction in required power can be manifested in cheaper transmitters and receivers.

A periodic interleaver is an interleaver for which the interleaving permutation is a periodic function of time. Two basic types of periodic interleavers are known in the prior art; block interleavers and convolutional interleavers.

A block interleaver writes symbols into an array by columns, and reads them out by rows. The de-interleaver writes the received symbols by rows, and reads them out by columns, thus, reversing the interleaving operation. The interleaving/de-interleaving permutation is performed on block boundaries.

Assuming a block length (number of columns) of N and an interleave depth (number of rows) of B, the number of memory locations required to implement a block interleaver is 2×N×B, since all of the symbols must be written into memory before they can be read out.

A convolutional Interleaver performs a periodic permutation over a continuous semi-infinite sequence of symbols. This group of interleavers results in an easier synchronization scheme and requires a smaller RAM configuration while achieving the same performance.

A convolutional helical interleaver achieves the same performance as the block interleaver, but requires only half as much memory for implementation. In the interleaver operation, reading is done by rows and writing is done by columns. However, the write location is forced to equal the read location after each N symbols. This configuration enables the memory requirement to be reduced to N×B.

Optimal implementations for convolutional periodic interleavers are proposed in an article entitled "Realization of Optimum Interleavers", by John Ramsey, in IEEE Transactions on Information Theory, May 1970, pp. 338–345, and also in an article entitled "Burst-Correcting Codes for the Classic Bursty Channel", by G. David Forney, in IEEE Transactions on Communications Technology, Vol. COM-19, No. 5, October 1971, pp. 772–780.

These solutions, although different, are optimal and reach the minimum bound of required memory and total end to end delay. They both reduce the required memory to about (N×B)/2 at the transmitter and at the receiver, which is half the memory required for a helical interleaver, and about 25% of the memory required for a block interleaver.

Forney's optimal convolutional interleaver configuration is illustrated in FIG. 2. An interleaver 30 at a transmitting end of a communications channel 32 comprises a plurality of shift register segments 34, 36, 38 and 40 having different lengths. A de-interleaver 42 at a receiving end of the channel 32 comprises a plurality of shift register segments 44, 46, 48 and 50 having the same lengths as the segments 40, 38, 36 and 34 of the interleaver 30 respectively.

The length $C_K$ (the number of stages in the shift registers) of each segment 34, 36, 38 and 40 is selected in accordance with a parameter M=N/B and a segment number K such that $C_K$=K×M=K×(N/B). There are B segments, for which K is $K_0$ to $K_{(B-1)}$ respectively.

For the first segment 34, K=0, and the length C=0 (the first segment 34 is a direct connection). For the second segment 36, K=1, and C=M. For the last segment 40, K=B−1, and C=(B−1)×M.

The interleaver 30 further comprises an input switch 52 and an output switch 54, whereas the de-interleaver 42 comprises an input switch 56 and an output switch 58. The interleaver 30 is operated by using the switches 52 and 54 to sequentially select the segments 34, 36, 38 and 40.

To select the segment 34, for example, the switches 52 and 54 are moved to the illustrated positions such that the input of the segment 34 is connected to the input of an encoder such as illustrated at 18 in FIG. 1, and the switch 54 is connected between the output of the segment 34 and the channel 32.

After a segment 34, 36, 38 or 40 is selected, the oldest symbol or data bit in the segment is read out from the right end of the respective shift register, a new symbol is written into the left end of the shift register, and all other symbols are shifted to the right. The switches 52 and 54 are then operated to select the next segment. On the de-interleaver side the reverse operation is performed using the switches 56 and 58, and the original order is restored.

Although providing effective interleaving/de-interleaving operation with reduced memory requirements, Forney's convolutional interleaver configuration as described in the above referenced article suffers from several disadvantages.

1. The shift register configuration requires a disproportionally large area when implemented on a semiconductor chip.
2. The hard-wired architecture constrains the user to a pre-defined set of system parameters.
3. B must divide N. For this reason, some (B,N) pairs are not allowed.

SUMMARY OF THE INVENTION

The method described above with reference to FIG. 2 (Forney's optimal convolutional interleaving/de-interleaving solution) cannot be implemented in a compact manner on a semiconductor chip in its shift register configuration.

The present method and apparatus accomplish the heretofore unrealized goal of implementing Forney's method in a compact arrangement. However, the present invention is not so limited, and can be further applied to other interleaving/de-interleaving methods, including the block and helical schemes described above.

Instead of shifting data along paths of varying shift registers delays, the present method leaves the data in its original RAM location, and changes the RAM's read and write addresses. Thus, the functionality is maintained but the overall chip size is significantly reduced.

The present convolutional interleaver/de-interleaver requires only a single random access memory, resulting in a smaller configuration while accomplishing the goals of the prior art shift register methodology.

In a method and apparatus for selective convolutional interleaving or de-interleaving of symbols or data bits, a plurality of segments are defined in random access memory (RAM), with each segment including a different number of locations for storing symbols.

Previously stored symbols are sequentially read out of current locations in the segments respectively, and new symbols are read into the current locations. Next locations in the segments are redesignated as current locations respectively, and the operation is repeated until all of the symbols have been interleaved or de-interleaved.

The first location in each segment is designated by a respective segment pointer. The current and next locations are designated as relative offset pointers from the segment pointers, and these locations are incremented by incrementing the offset pointers.

Interleaving or de-interleaving operation is determined by the direction in which the segments are sequentially selected for the read/write operations.

The present arrangement enables a flexible architecture, in which all of the system parameters are fully programmable as follows.

1. The interleaving depth B can be changed according to the system requirements.
2. The block length N is programmable to any number.
3. A single input signal determines if the apparatus will function as an interleaver on the encoder side, or as a de-interleaver on the decoder side.
4. Special relationships between N and B are not required. The method described in the above referenced article to Ramsey and the helical interleaving scheme constrain the system to relative primeness relations between N and B. In the method described in the above referenced article to Forney, B must divide N. The present method has no such constraints.

The above and other objects, features and advantages of the present invention will become apparent to those skilled in the art from the following detailed description taken with the accompanying drawings, in which like reference numerals refer to like parts.

DETAILED DESCRIPTION OF THE INVENTION

Figure 3:
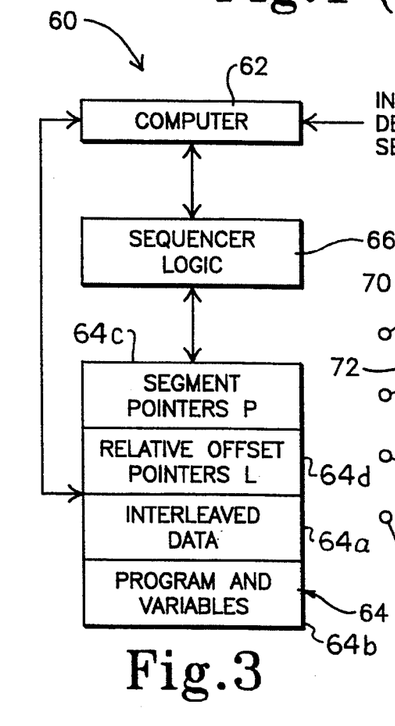
FIG. 3 is a block diagram illustrating a convolutional interleaver/de-interleaver embodying the present invention.

A convolutional interleaver/de-interleaver apparatus 60 that is constructed and operates in accordance with a method of the present invention is illustrated in FIG. 3. The apparatus 60 comprises a computer 62, which can be a microprocessor or other suitable computing element. It is further within the scope of the invention to embody the computer 62 as dedicated hardwired circuitry.

The apparatus 60 further comprises a random access memory (RAM) 64 including a portion 64a for storing data that is being interleaved or de-interleaved. The memory 64 also stores an operating program and intermediate variables for controlling the operation of the apparatus 60 using the computer 62.

Further illustrated in FIG. 3 is a sequencer logic unit 66 for controlling addressing of the memory 64 and other arithmetic and logical operations under control of the computer 62. Although the unit 66 is illustrated as being a separate element, it is within the scope of the invention to incorporate the functionality of the unit 66 into the computer 62.

The portion 64b of the memory 64 is also divided into a plurality of segments for storing data symbols or bits that are to be interleaved or de-interleaved. Where the apparatus 60 is applied for practicing the interleaving/de-interleaving method described in the above-referenced article to Forney, the segments are defined as having different numbers of locations $C_K$ respectively, which are defined by the relation $C_K = K \times \lceil N/B \rceil$.

The term $\lceil N/B \rceil$ is the mathematical "ceiling" of the ratio N/B, such that the numerical value of N/B, which does not have to be an integer in accordance with the present invention, is rounded up to the next highest integer value. For example, if N/B=2.3, then $\lceil N/B \rceil = 3$.

More specifically, K is a segment number from $K_0$ to $K_{(B-1)}$, $C_K$ is the number of memory locations in the segment K, N is a predetermined block length of the symbols and B is a predetermined interleaving depth. A variable M is defined as $M = \lceil N/B \rceil$.

Figure 6:
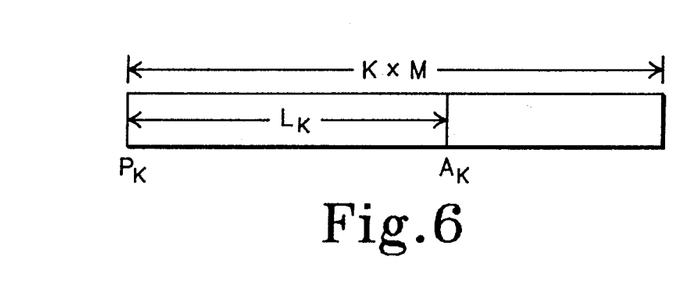
FIG. 6 is a diagram illustrating a segment offset pointer that is used to designated the memory locations of FIG. 5.

The addresses of first memory locations in the segments are designated by fixed segment pointers $P_K$. The other locations in the segments are designated by variable offset pointers $L_K$, which specify the relative offset from the first locations in the segments. The actual address $A_K$ of a particular memory location in a segment having a segment number K is the sum or concatenation of the segment pointer $P_K$ and the offset pointer $L_K$, such that $A_K = P_K + L_K$.

It is further within the scope of the invention to make each segment pointer $P_K$ equal to an offset from the first location of a specified area in the memory 64. In such a case, the address of a particular location $A_K$ is equal to the concatenation of the address of this first location and $P_K + L_K$.

An exemplary memory allocation for the apparatus 60 is illustrated in TABLE 1. It will be assumed that the maximum interleaving depth B is equal to 15, and that the segment pointers $P_K$ are stored in memory starting at location address 0.

TABLE 1

MEMORY ALLOCATION
(B = 15)

| LOCATION | CONTENTS |
| --- | --- |
| 0 | Reserved |
| 1 | Reserved |
| 2 | Segment Pointer 1 (Byte 1) |
| 3 | Segment Pointer 1 (Byte 2) |
| 4 | Segment Pointer 2 (Byte 1) |
| 5 | Segment Pointer 2 (Byte 2) |
| 6 | Segment Pointer 3 (Byte 1) |
| 7 | Segment Pointer 3 (Byte 2) |
| 8 | Segment Pointer 4 (Byte 1) |
| 9 | Segment Pointer 4 (Byte 2) |
| 10 | Segment Pointer 5 (Byte 1) |
| 11 | Segment Pointer 5 (Byte 2) |
| 12 | Segment Pointer 6 (Byte 1) |
| 13 | Segment Pointer 6 (Byte 2) |
| 14 | Segment Pointer 7 (Byte 1) |
| 15 | Segment Pointer 7 (Byte 2) |
| 16 | Segment Pointer 8 (Byte 1) |
| 17 | Segment Pointer 8 (Byte 2) |
| 18 | Segment Pointer 9 (Byte 1) |
| 19 | Segment Pointer 9 (Byte 2) |
| 20 | Segment Pointer 10 (Byte 1) |
| 21 | Segment Pointer 10 (Byte 2) |
| 22 | Segment Pointer 11 (Byte 1) |
| 23 | Segment Pointer 11 (Byte 2) |
| 24 | Segment Pointer 12 (Byte 1) |
| 25 | Segment Pointer 12 (Byte 2) |
| 26 | Segment Pointer 13 (Byte 1) |
| 27 | Segment Pointer 13 (Byte 2) |
| 28 | Segment Pointer 14 (Byte 1) |
| 29 | Segment Pointer 14 (Byte 2) |
| 30 | Offset Pointer 1 |
| 31 | Offset Pointer 2 |
| 32 | Offset Pointer 3 |
| 33 | Offset Pointer 4 |
| 34 | Offset Pointer 5 |
| 35 | Offset Pointer 6 |
| 36 | Offset Pointer 7 |
| 37 | Offset Pointer 8 |
| 38 | Offset Pointer 9 |
| 39 | Offset Pointer 10 |
| 40 | Offset Pointer 11 |
| 41 | Offset Pointer 12 |
| 42 | Offset Pointer 13 |
| 43 | Offset Pointer 14 |
| 44 | DATA |
| ↓ | ↓ |
| 267 | DATA |

As illustrated in TABLE 1, locations 0 and 1 are reserved for use of the operating program. Since B=15 and the first segment is constituted by a direct connection, 14 segment pointers $P_K$ are required for an interleaving depth of B=15.

In a typical application, two bytes of data are required to specify each segment pointer $P_K$. For example, the two bytes for segment pointer 1 are stored in locations 2 and 3, the two bytes for segment pointer 2 are stored in locations 4 and 5, and the two bytes for segment pointer 14 are stored in locations 28 and 29 respectively.

Only one byte of data is required for each offset pointer $L_K$. The offset pointers $L_K$ are stored in locations 30 through 43 respectively.

Including the reserved locations 0 and 1, a total of 44 memory locations having addresses 0 to 43 are required to store the segment pointers $P_K$ and the offset pointers $L_K$. The data to be interleaved or de-interleaved is stored in memory locations 44 to 267.

TABLE 2 illustrates the first address of each segment as specified by the segment pointer $P_K$, the number of locations $C_K=K\times M$, and the range of addresses for each segment in the exemplary case of B=15. For example, the segment having the segment number K=4 begins at location 56, and consists of 8 memory locations 56 to 63.

TABLE 2

| | SEGMENT POINTERS (B = 15) | | |
|---|---|---|---|
| SEGMENT K | POINTER $P_K$ | $C_K = K \times M$ | LOCATIONS |
| 0 | N/A | 0 | N/A |
| 1 | 44 | 3 | 44–45 |
| 2 | 46 | 4 | 46–49 |
| 3 | 50 | 6 | 50–55 |
| 4 | 56 | 8 | 56–63 |
| 5 | 64 | 10 | 64–73 |
| 6 | 74 | 12 | 74–85 |
| 7 | 86 | 14 | 86–101 |
| 8 | 102 | 16 | 102–119 |
| 9 | 120 | 18 | 120–139 |
| 10 | 140 | 20 | 140–161 |
| 11 | 162 | 22 | 162–185 |
| 12 | 186 | 24 | 186–211 |
| 13 | 212 | 26 | 212–239 |
| 14 | 240 | 28 | 240–267 |

In the illustrated example of the apparatus 60, the interleaving depth B can have any selected value from 1 to 15. In a case in which a value of B smaller than 15 is selected, the segment pointers $P_K$ for values of K higher than B−1 are unused.

Figure 5:
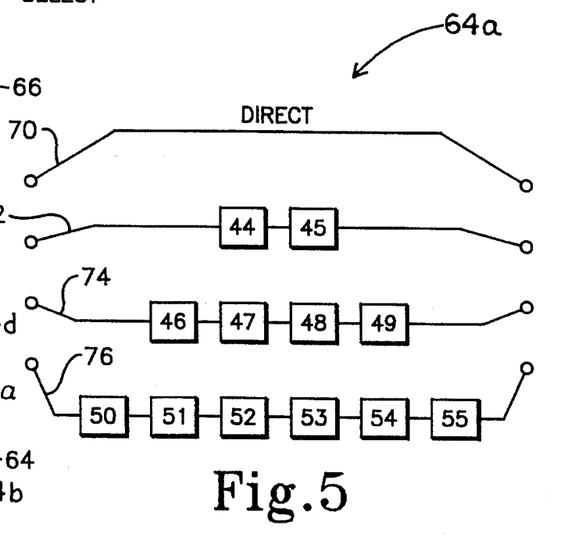
FIG. 5 is a diagram illustrating an arrangement of memory locations in the convolutional interleaver/de-interleaver.

FIG. 5 and TABLE 3 schematically illustrate a simplified example of the invention, in which the block length N=8, and the interleave depth B=4. M=8/4=2, and B−1=3. The apparatus 60 as illustrated in FIG. 5 comprises B=4 segments, including a segment 70 constituted by a direct connection, and three segments 72, 74 and 76 having two, four and six locations respectively.

TABLE 3

| MEMORY ALLOCATION (B = 4) | |
|---|---|
| LOCATION | CONTENTS |
| 0 | Reserved |
| 1 | Reserved |
| 2 | Segment Pointer 1 = 44 (Byte 1) |
| 3 | Segment Pointer 1 = 44 (Byte 2) |
| 4 | Segment Pointer 2 = 46 (Byte 1) |
| 5 | Segment Pointer 2 = 46 (Byte 2) |
| 6 | Segment Pointer 3 = 50 (Byte 1) |
| 7 | Segment Pointer 3 = 50 (Byte 2) |
| 8 | 0 |
| ⋮ | ⋮ |
| 29 | 0 |
| 30 | Offset Pointer 1 (0–2) |
| 31 | Offset Pointer 2 (0–4) |
| 32 | Offset Pointer 3 (0–6) |
| 33 | 0 |
| ⋮ | ⋮ |
| 43 | 0 |
| 44 | DATA |
| ⋮ | ⋮ |
| 267 | DATA |

The segment 70 (K=0) is a direct connection, and is not represented in the memory 64. Since fourty four memory locations are used to store the segment pointers $P_K$ and the offset pointers $L_K$ in portions 64c and 64d of memory 64, the first location of the segment 72 (K=1) is location 44. Since M=N/K=2, the number of locations $C_K$ for the segment 72 is equal to 1×M=2. Thus, the segment 72 will consist of two memory locations 44 and 45.

Similarly, the segment 74 consists of 2×M=4 memory locations, starting with location 46. The segment 76 consists of six memory locations starting at location 50. The last location in the segment 76 has the address 55.

Figure 4:
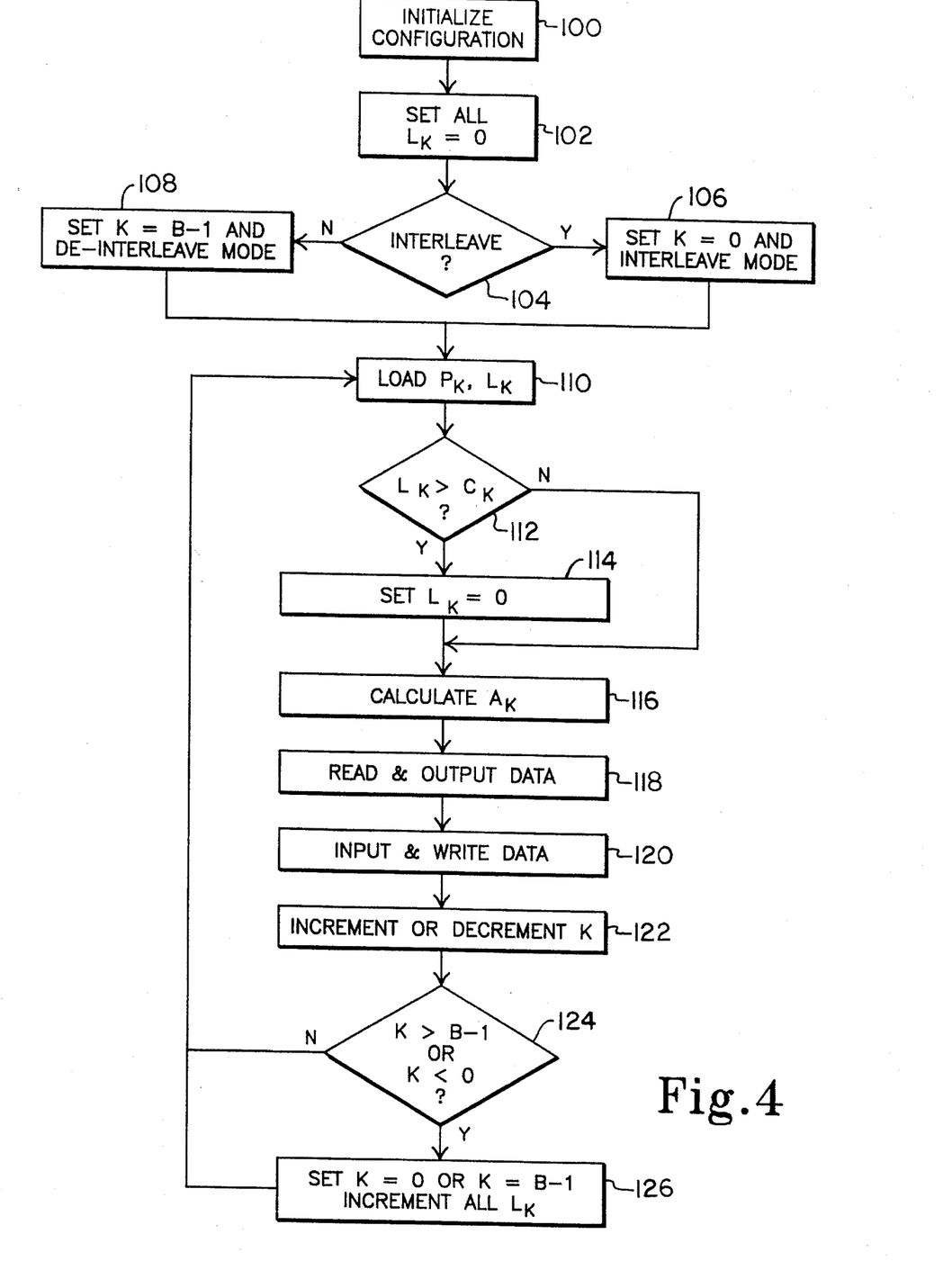
FIG. 4 is a flowchart illustrating a method of convolutional interleaving and de-interleaving using the convolutional interleaver/de-interleaver of FIG. 3.
Figure 7:
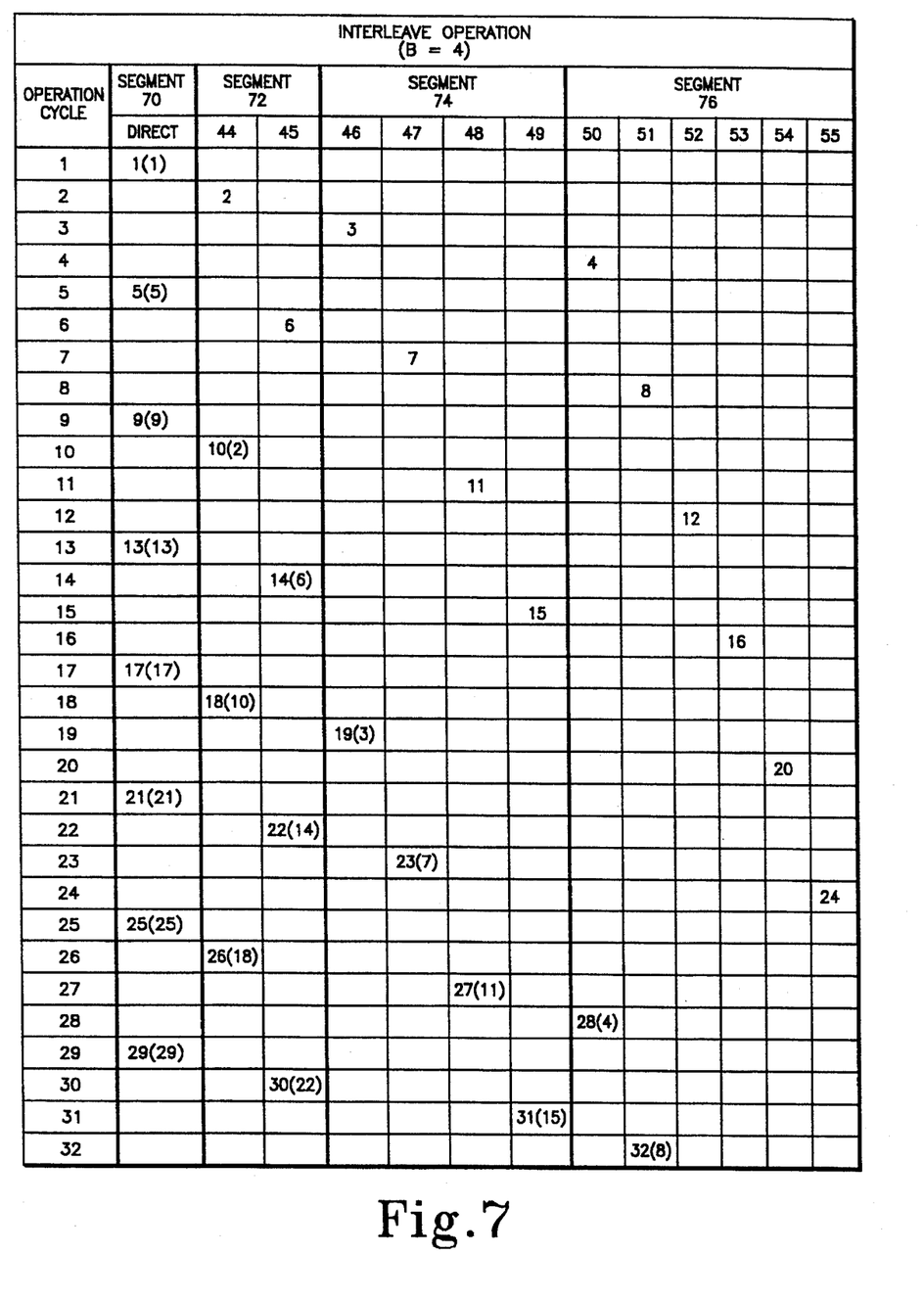
FIG. 7 is a timing diagram illustrating an exemplary convolutional interleaving operation in accordance with the present method.

The operation of the simplified embodiment of the apparatus 60 in which N=8 and B=4 is illustrated in the flow chart of FIG. 4. FIG. 7 is a chart illustrating how data is read out of and written into the memory 64.

As illustrated in FIG. 4, the first step 100 of the present method is to initialize the configuration. This comprises selecting the values of N and B, calculating the value of M, and calculating the lengths of the segments 70, 72, 74 and 76 based on these parameters.

The initialization phase further comprises designating the memory locations and addresses in the memory 64 corresponding to the segments 70, 72, 74 and 76, calculating the values of the segment pointers $P_K$, and storing these values in the memory 64 as indicated by the allocation scheme of TABLE 3. Depending upon a particular application, these values can be stored in the memory 64 as firmware, can be downloaded from an external unit (not shown), or can be hardwired if the parameters in the particular application will not be changed.

All of the offset pointers $L_K$ are set to 0 (step 102). An interleave/de-interleave select signal is then applied to the computer 62. This signal has a first value if an interleave mode operation is to be performed, and a second value if a de-interleave mode operation is to be performed.

If the interleave operation is selected (step 104), K is set to 0 and the sequencer logic unit 66 is set to operate in increment mode. If the de-interleave operation is selected, K is set to B−1 and the sequencer logic unit 62 is set to operate in decrement mode (step 108).

The interleave mode operation will be described with reference to FIG. 7. The segments 70, 72, 74 and 76 in the memory 64 in which the data is stored are sequentially accessed by the sequencer logic unit 66. The segment number K is initially set to 0 (for interleave mode).

In the table of FIG. 7, data that is being written into the memory 64 is not enclosed in parentheses, whereas data that is being read out of the memory 64 is enclosed in parentheses. FIG. 7 illustrates 32 operation cycles, during which time 32 symbols or data bits are processed by the apparatus 60 respectively.

The sequencer logic unit 66 is programmed to recognize that the segment 70 is a direct connection, and will not attempt to load a segment pointer $P_0$ or an offset pointer $L_0$ from the memory 64 during the first operation cycle. Instead, the sequencer logic unit 66 controls the computer 62 such that any data that appears at the input of the apparatus 60 when K=0 will be passed directly through to the output thereof.

The segment number K is incremented to the value of 1 for the second operation cycle. A test is made to determine if all of the segments 70, 72, 74 and 76 have been accessed. This is done by comparing K to B−1 (step 124). If K is greater than B−1, it indicates that all of the segments 70, 72, 74 and 76 have been accessed, and that K should be reset to 0 (step 126). Since in this case K=1, the reset operation is not performed.

The segment pointer $P_1$ and the offset pointer $L_1$ are loaded from the memory 64 (step 110), and the address $A_1$ of the current location in the segment 72 that is to be accessed is calculated as the sum or concatenation thereof. Since $L_1=0$, the first address $A_1$ is equal to the address of the first location in the segment 72, or 44 (steps 112 and 116).

A test is made to determine if all of the locations in the segment 72 have been accessed. This is done by comparing $L_K$ to $C_K$ (step 112). If $L_K$ is greater than $C_K$, it indicates that all of the locations in the segment 72 have been accessed, and that $L_K$ should be reset to 0 (step 114). Since in this case $L_1=0$, the reset operation is not performed.

During the first four operation cycles, there is no previously stored data in the memory 64, and the computer 62 is programmed to ignore any data that is read out (step 118). However, new data is written into the memory 64 (step 120). During the second operation cycle, the second data bit is written into location 44 of the segment 72.

During the third operation cycle, K is incremented to the value of 2 (step 122), the segment pointer $P_2$ and the offset pointer $L_2$ are loaded from the memory 64 (step 110), and the address $A_2$ of the current location in the segment 74 is calculated as 46+0=46 (step 116). The third data bit is written into the location 46 (step 120). During the fourth operation cycle, K is incremented to the value 3 (step 122) and the fourth data bit is similarly written into the first location 50 of the segment 76 (step 120).

After all of the segments 70, 72, 74 and 76 have been accessed and four data bits have been written therein respectively, the next operation of incrementing K (step 122) produces a value of K=4. Since this is larger than B−1=3, K is reset to zero and all $L_K$ are incremented (step 126). This latter operation has the effect of redesignating next locations in all of the segments 70, 72, 74 and 76 as new current locations respectively.

The segment 70 is accessed during the fifth operation cycle. During the sixth operation cycle, since $L_1=1$, $A_1=44+1=45$, the sixth data bit is written (step 120) into the second location 45 of the segment 72. The seventh and eighth data bits are written (step 120) into the second locations 47 and 51 of the segments 74 and 76 respectively.

The ninth data bit goes through the direct connection of the segment 70. Since the second data bit was written into the location 44 of the segment 72 during the second operation cycle, it is read out (step 118) during the tenth operation cycle and a tenth data bit is written into the location 44 (step 120). It will be understood that the offset pointer $L_1$ was incremented (step 126) to the value of 2 which is greater than $C_1=1$, and was reset to zero during the tenth operation cycle to point to the first location 44 in the segment 72.

The operation continues in an essentially similar manner during the remaining operation cycles. As soon as the value of an offset pointer $L_K$ is incremented above the number $C_K$ of memory locations in the segment K, it is reset to zero.

In accordance with the present invention, path delays for the segments 70, 72, 74 and 76 are inherent in the apparatus 60 that are equivalent to those in the prior art shift register implementation of the convolutional interleaver/de-interleaver as described above. The present delays are implemented by performing the read operation before the write operation for each location in the memory 64.

A particular memory location will be read exactly "segment length" cycles after it was written. Thus, an imaginary delay chain is constructed to replace the shift mechanism. The delay for each segment 70, 72, 74 and 76 is equal to $C_K \times N$. Thus, the delay in the segment 70 is $0 \times 4=0$ operation cycles, the delay in the segment 72 is $2 \times 4=8$ operation cycles, the delay in the segment 74 is $4 \times 4=16$ operation cycles and the delay in the segment 76 is $6 \times 4=24$ operation cycles.

The de-interleaving operation is essentially similar to the interleaving operation, except that K is initially set to B−1 and then decremented. Due to the inherent delays in the segment access cycles as described above, the timing of the de-interleaving operation will be exactly conjugate to that of the interleaving operation, and the de-interleaving operation will produce an exact replica of the original data.

The present invention provides numerous advantages over the prior art shift register implementation, including the following 1. Reduced size—the present single RAM implementation can be as much as 90% smaller than a prior art shift register based device.

2. Programmability—the present apparatus enables the user to program the desired system parameters. N and B can be changed according to the system specifications.

3. Flexibility—there are no constraints on relations between N and B, with all combinations being supported. All of the fixed offset and segment pointers, that determine the actual interleaving depth and array configuration, are calculated during the initialization phase. This makes the present apparatus 60 a general purpose implementation, which can be easily adapted to different environmental and system applications.

4. Interleaver/De-Interleaver modes—the present implementation allows the user to choose the desired mode of operation. Other configurations require two distinct modules to perform the two operations. The present apparatus can function in both modes, with one selection signal determining the mode of operation.

5. Simplified Synchronization—the present convolutional interleaver/de-interleaver has a synchronization ambiguity of degree B, while the ambiguity is of degree N×B for block de-interleavers. This property enables a much simpler system synchronization scheme, thereby reducing the amount of required circuitry and the system acquisition time.

6. Easy Routing—by using a single RAM instead of conventional shift register arrays, compact packing and routing become possible. Different system parameters can be accommodated by flexible addressing circuitry, and not by numerous wires going back and forth through the design.

7. Reduced Global Control Circuitry—by slightly increasing the size of the RAM array, most of the parameters used by the address calculating circuitry and global control can be stored along with the interleaved data. This eliminates the overhead related to "address calculation circuitry" by storing all of the address components in the same RAM used for storing the data for interleaving/de-interleaving.

Various modifications will become possible for those skilled in the art after receiving the teachings of the present disclosure without departing from the scope thereof.

I claim:

1. A method for selectively interleaving and de-interleaving symbols, comprising the steps of:

(a) a defining a sequence of memory segments including locations for storing said symbols;

(b) reading a stored symbol out of a current location in each of said segments of the sequence;

(c) writing a current symbol into a current location in each of said segments of the sequence;

(d) redesignating next locations in each of said segments as said current locations respectively; and (e) repeating steps (b) to (d) until said symbols have been reordered;

in which step (a) comprises defining B of said segments having different numbers of locations $C_K$ respectively in accordance with the relation $C_K = K \times \lceil N/B \rceil$, where K is a segment number from $K_0$ to $K_{(B-1)}$, $C_K$ is said number of locations in segment K, N is a predetermined block length of said symbols and B is a predetermined interleaving depth.

2. The method as in claim 1, in which step (a) comprises defining said segments as having different numbers of locations respectively.

3. The method as in claim 1, in which a step (a) further comprises defining segment $K_0$ as being a direct connection.

4. A method for selectively interleaving and de-interleaving symbols, comprising the steps of:

(a) a defining a sequence of memory segments including locations for storing said symbols;

(b) reading a stored symbol out of a current location in each of said segments of the sequence;

(c) writing a current symbol into a current location in each of said segments of the sequence;

(d) redesignating next locations in each of said segments as said current locations respectively; and (e) repeating steps (b) to (d) until said symbols have been reordered;

in which step (a) comprises defining said segments as being designated by segment pointers, and further comprises designating said current locations as relative offset pointers from said segment pointers respectively.

5. The method as in claim 4, in which step (d) comprises incrementing said offset pointers.

6. The method as in claim 4, in which steps (b) and (c) comprise sequentially selecting said segments for reading and writing respectively by incrementing said segment pointers for interleaving said symbols; and sequentially selecting said segments for reading and writing respectively by decrementing said segment pointers for de-interleaving said symbols.

7. The method as in claim 4, in which steps (b) and (c) comprise sequentially selecting said segments for reading and writing respectively by decrementing said segment pointers for interleaving said symbols; and sequentially selecting said segments for reading and writing respectively by incrementing said segment pointers for de-interleaving said symbols.

8. The method as in claim 4, in which step (a) comprises defining B of said segments having different numbers of locations $C_K$ respectively in accordance with the relation $C_K = K \times \lceil N/B \rceil$, where K is a segment number from $K_0$ to $K_{(B-1)}$, $C_K$ is said number of locations in segment K, N is a predetermined block length of said symbols and B is a predetermined interleaving depth.

9. The method as in claim 8, in which a step (a) further comprises defining segment $K_0$ as being a direct connection.

10. The A method as in claim 8, further comprising the steps, performed prior to step (b), of:

(f) selecting interleave operation or de-interleave operation;

(g) if said interleave operation is selected in step (f), controlling steps (b) and (c) to sequentially select said segments for reading and writing respectively by incrementing K starting from K=0; and (h) if said de-interleave operation is selected in step (f), controlling steps (b) and (c) to sequentially select said segments for reading and writing respectively by decrementing K starting from K=(B−1).

11. The method as in claim 8, further comprising the steps, performed prior to step (b), of:

(f) selecting interleave operation or de-interleave operation;

(h) if said interleave operation is selected in step (f), controlling steps (b) and (c) to sequentially select said segments for reading and writing respectively by decrementing K starting from K=(B−1); and (g) if said de-interleave operation is selected in step (f), controlling steps (b) and (c) to sequentially select said segments for reading and writing respectively by incrementing K starting from K=0.

12. The method as in claim 4, in which:

step (a) comprises setting said offset pointers to zero; and step (d) comprises incrementing said offset pointers.

13. The method as in claim 4, in which:

step (a) comprises the substeps of:

(f) defining maximum values of said offset pointers as being equal to numbers of locations in said segments respectively; and (g) setting said offset pointers to zero; and step (d) comprises the substeps of:

(h) incrementing said offset pointers;

(i) comparing said offset pointers with said maximum values respectively; and (j) setting an offset pointer to zero if a value thereof exceeds said respective maximum value.

14. An apparatus for selectively interleaving and de-interleaving symbols, comprising:

a memory including a plurality of segments having locations for storing said symbols;

a sequencer for sequentially reading stored symbols out of current locations in said segments, and sequentially writing current symbols into said current locations in said segments respectively; and a computer for redesignating next locations in said segments as said current locations respectively, and controlling the sequencer to repeat said reading and writing;

in which the memory comprises B segments that have different numbers of locations $C_K$ respectively in accordance with the relation $C_K = K \times \lceil N/B \rceil$, where K is a segment number from $K_0$ to $K_{(B-1)}$, $C_K$ is said number of locations in segment K, N is a predetermined block length of said symbols and B is a predetermined interleaving depth.

15. The apparatus as in claim 14, in which said segments have different numbers of locations respectively.

16. The apparatus as in claim 14, in which segment $K_0$ is a direct connection.

17. An apparatus for selectively interleaving and de-interleaving symbols, comprising:

a memory including a plurality of segments having locations for storing said symbols;

a sequencer for sequentially reading stored symbols out of current locations in said segments, and sequentially writing current symbols into said current locations in said segments respectively; and a computer for redesignating next locations in said segments as said current locations respectively, and controlling the sequencer to repeat said reading and writing;

in which the sequencer designates said segments by segment pointers, and the computer designates said current locations as relative offset pointers from said segment pointers respectively.

18. The apparatus as in claim 17, in which the computer redesignates said next locations in said segments as said current locations respectively by incrementing said offset pointers.

19. The apparatus as in claim 17, in which the computer sequentially selects said segments for reading and writing respectively by incrementing said segment pointers for interleaving said symbols; and sequentially selects said segments for reading and writing respectively by decrementing said segment pointers for de-interleaving said symbols.

20. The apparatus as in claim 17, in which the computer sequentially selects said segments for reading and writing respectively by decrementing said segment pointers for interleaving said symbols; and sequentially selects said segments for reading and writing respectively by incrementing said segment pointers for de-interleaving said symbols.

21. The apparatus as in claim 17, in which the memory comprises B segments that have different numbers of locations $C_K$ respectively in accordance with the relation $C_K = K \times \lceil N/B \rceil$, where K is a segment number from $K_0$ to $K_{(B-1)}$, $C_K$ is said number of locations in segment K, N is a predetermined block length of said symbols and B is a predetermined interleaving depth.

22. The apparatus as in claim 21, in which segment $K_0$ is a direct connection.

23. The apparatus as in claim 21, in which:

the computer comprises a selector for selecting interleave operation or de-interleave operation;

if said interleave operation is selected, the computer controls the sequencer to sequentially select said segments for reading and writing respectively by incrementing K starting from K=0; and if said de-interleave operation is selected, the computer controls the sequencer to sequentially select said segments for reading and writing respectively by decrementing K starting from K=(B−1).

24. The apparatus as in claim 21, in which:

the computer comprises a selector for selecting interleave operation or de-interleave operation;

if said interleave operation is selected, the computer controls the sequencer to sequentially select said segments for reading and writing respectively by decrementing K starting from K=(B−1); and if said de-interleave operation is selected, the computer controls the sequencer to sequentially select said segments for reading and writing respectively by incrementing K starting from K=0.

25. The apparatus as in claim 17, in which the computer initially sets said offset pointers to zero, and increments said offset pointers after the sequencer performs said reading and writing.

26. The apparatus as in claim 17, in which the computer:

defines maximum values of said offset pointers as being equal to numbers of locations in said segments respectively;

initially sets said offset pointers to zero;

increments said offset pointers after the sequencer performs said reading and writing;

compares said offset pointers with said maximum values respectively; and sets an offset pointer to zero if a value thereof exceeds said respective maximum value.

* * * * *